United States Patent [19]

Jensik et al.

[11] Patent Number: 4,985,655
[45] Date of Patent: Jan. 15, 1991

[54] CRYSTAL HEADER PACKAGE

[75] Inventors: Charles J. Jensik; William P. Hanson, both of Carlisle, Pa.

[73] Assignee: Piezo Crystal Company, Division of PPA Industries, Inc., Carlisle, Pa.

[21] Appl. No.: 199,647

[22] Filed: May 27, 1988

[51] Int. Cl.⁵ .......................................... H01L 41/08
[52] U.S. Cl. .................................... 310/344; 310/353
[58] Field of Search ................ 310/344, 348, 351–353

[56] References Cited

U.S. PATENT DOCUMENTS

| | | | |
|---|---|---|---|
| 3,931,388 | 1/1976 | Hafner et al. | 310/344 |
| 4,127,840 | 11/1978 | House | 338/4 |
| 4,266,156 | 5/1981 | Kizaki | 310/344 |
| 4,266,157 | 5/1981 | Peters | 310/344 X |
| 4,354,130 | 10/1982 | Ono et al. | 310/313 A |

FOREIGN PATENT DOCUMENTS 2755116  6/1979  Fed. Rep. of Germany ...... 310/344

*Primary Examiner*—Mark O. Budd
*Attorney, Agent, or Firm*—Mason, Fenwick & Lawrence

[57] ABSTRACT

A crystal header package with a sapphire bottom plate and a method of making same. The package has a low profile design consisting of two components defining a cover and a platform that are joined together by cold welding. A KOVAR washer is used within a seal between the sapphire bottom plate and the platform.

9 Claims, 2 Drawing Sheets

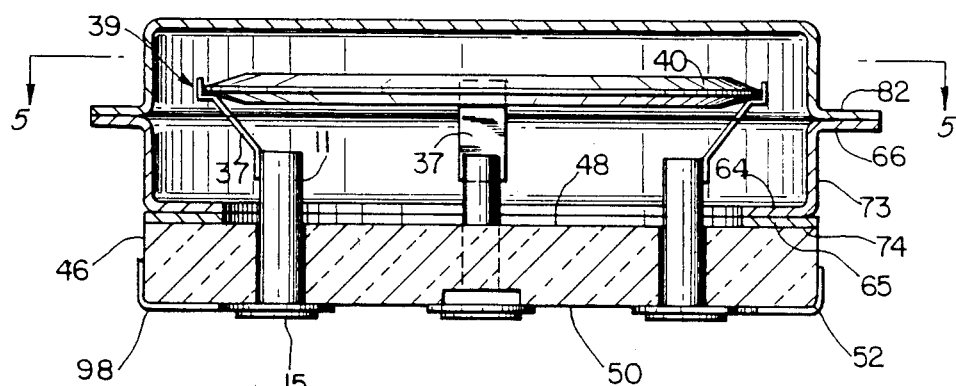
FIG. 4
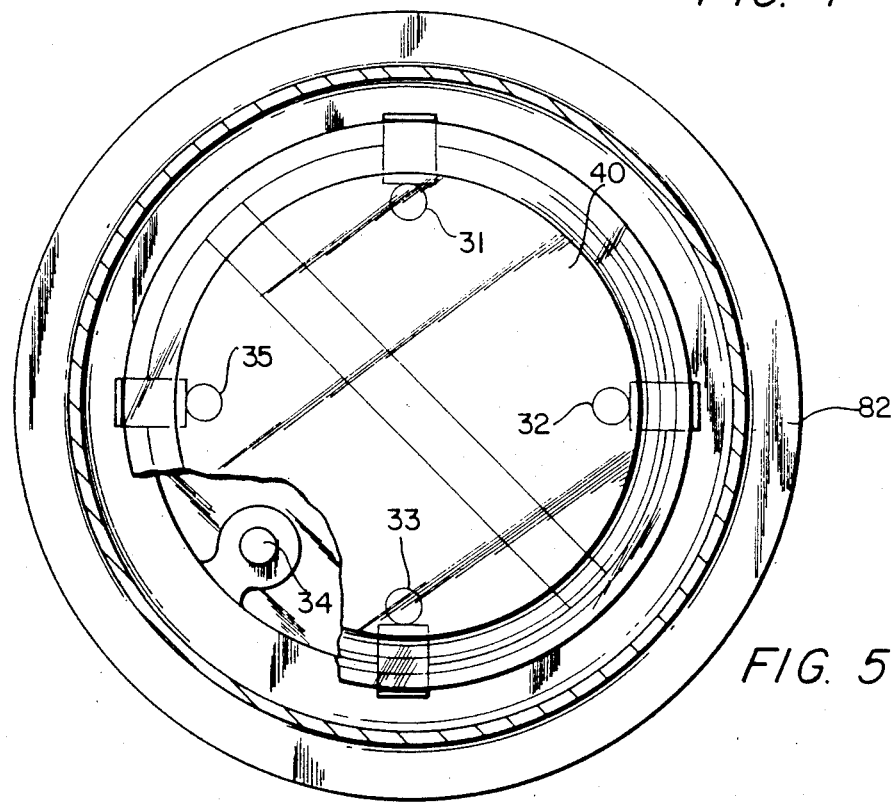
FIG. 5
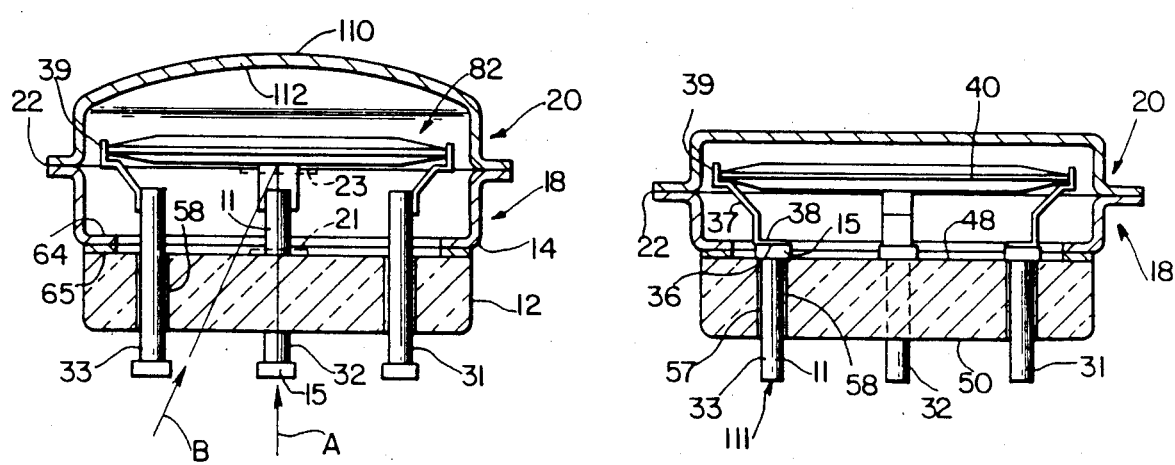
FIG. 6
FIG. 7

CRYSTAL HEADER PACKAGE

FIELD OF THE INVENTION

The present invention relates to a metallic housing for encapsulation of electronic components, in general, and to a hermetically sealed crystal header package for housing a piezoelectric crystal where high reliability is paramount, in particular. The present invention is also directed to the method of making and assembling the sealed header package.

BACKGROUND OF THE INVENTION

The housing of piezoelectric crystals, semiconductor components, quartz crystal oscillators, relays and electrical assemblies must be performed hermetically in many applications. When the housings are sealed shut by such common technical methods as brazing, soldering and resistance welding, trace impurities are formed within the capsule (brazing vapors, for example), which may impair the efficiency of operation of the component mounted within the housing and, thus, detract from the component's quality and reliability.

The present invention relates in general to electronic component mounting arrangements and more particularly to a low profile crystal header package with an improved crystal mounting arrangement which facilitates multiple electrical connections to each surface of the crystal plate without flexing or repositioning the crystal plate. The present invention is directed to that segment of the market where high reliability is very important.

It has long been the practice to hermetically seal the protective metal crystal header package. Once sealed, the crystal package can be used in many different environments with a high degree of confidence that the crystal plate mounted therein will reliably perform at the desired frequency.

In recent years, space limitations have required smaller and smaller crystal mounting assemblies, which has caused an increase in the electrical and mechanical problems relative to properly mounting a crystal blank within a crystal header package, while not causing damage to the crystal blank, maintaining frequency standardization, and avoiding internal environment contamination during the sealing process. Likewise, as crystal applications have become more and more complex, more mechanical and electrical contact points are required, on smaller and smaller crystal blanks. Thus, it has been the prior art practice to provide a small crystal package which allows the mounting of the crystal blank within a metal evacuated container, such container having terminal pins projecting within the internal cavity where the pins are connected via wire leads to the electrodes found on the crystal blank. These same terminal pins also serve to support the crystal blank within the evacuated container as its seams are sealed either by soldering, hot welding or cold welding technologies.

The use of high pressure cold welding technology has found favor in the prior art since cold welding has the primary advantage of being free from fumes and contamination. In cold welding, a molecular bond is obtained by a cold flow of metal under extremely high pressures without heat. Because of the pressures involved, cold welding has an occasional disadvantage of causing distortion to the metal container during the welding operation, which may result in the internal terminal pins being displaced from their intended positions. Since the crystal blank is secured by the terminal pins, distortion of the pins will cause a stress to be applied to the crystal blank, which will adversely affect the frequency characteristics of the crystal blank.

In the prior art there are various types of crystal mounting apparatus that are commonly used. In one approach, the quartz crystal blank is supported by a center mounting post, which allows horizontal mounting of the crystal and reduces overall height of the crystal package assembly. A disadvantage of this type of crystal mounting approach is that the crystal blank needs to be adequately supported during the wire bonding process so as to withstand the surface pressures involved without sustaining damage to the crystal blank. During assembly of the crystal wafer onto its respective center post mounting position, it is desirable to avoid overstressing the wafer. Such stresses can occur by the means which are used to mount the crystal wafer in the crystal package or by the mechanical stresses which develop during the hermetic sealing of the crystal package itself.

In addition to sealing the component parts used to make the crystal housing, the prior art has also been concerned with sealing the interface between the housing and the terminals. With regard to this type of sealing, the prior art generally consisted of the steps of hermetically sealing a pair of terminals in an eyelet to form a header, mounting a crystal wafer on an associated header, and hermetically sealing the header to a metal or glass container with the crystal wafer positioned within the container. Headers have been characterized either as matched glass or compression glass headers. In a glass header, a single vitreous material is used to fabricate the terminals and eyelets, while a second vitreous material which has the same thermal coefficient of expansion as the eyelet and terminals is used to seal the terminals to the eyelet. Generally, the eyelet and terminals are made of an iron-nickel-cobalt alloy material such as KOVAR and the vitreous material is a glass which has been selected to have a thermal coefficient of expansion substantially the same as that of KOVAR.

The sealing process is facilitated by placing molten glass in the eyelet around the terminals and then cooling the glass to cause it to shrink and tightly grip the terminals. The similar coefficients of thermal expansion of the KOVAR components and the vitreous material insure that the seal between the terminals and the eyelet will be maintained. In both the matched and the compression glass headers the integrity of the terminal to eyelet seal depends upon the attainment of a good seal between the terminal and the glass.

There is thus a need for a low-profile crystal header package that has an extremely low leakage rate of contaminants while exhibiting a high degree of crystal frequency stability. The present invention is directed toward filling that need.

SUMMARY OF THE INVENTION

A header package embodying the teachings of the present invention basically comprises a sapphire base formed in the general shape of a disk from a single crystal. Mounted thereto through the use of a KOVAR disk is a metallic housing that consists of a lower housing portion and an upper housing portion joined together at a flange portion through the use of a cold weld. Mounted within metallized apertures provided in the sapphire base are five terminals arranged in a conventional cold weld crystal holder pattern.

The top portion of each terminal pin has welded to it a metallic ribbon that terminates in a crystal-supporting ledge. Collectively, the ledges of four of the ribbons support a plano-convex piezoelectric crystal. At the point of contact between the crystal edge and the support ledge, each of the ribbons is bonded to the crystal through thermocompression.

The terminals terminate at one end in a flat disk-like portion emanating from which is a wrap around metallized surface that has been previously deposited on the bottom and side surfaces of the sapphire base member.

Defined along a circumferential line that is concentric with the central axis of the base member are a series of five apertures that are positioned in what is known as a bulk acoustic wave and lateral field terminal arrangement. Each of the apertures provides a mounting tube for the terminal pins. Defined within the bottom surface of the base member is a slot or groove that extends across the entire diameter of the bottom surface and passes through the central axis of the base. The slot facilitates placement and orientation of the header package on a printed circuit board.

The sapphire base in conjunction with the KOVAR ring provides the greatest benefit by minimizing leakage of contaminates. The clarity of the sapphire provides a window to allow a laser to frequency adjust the crystal resonator.

The lower housing portion is made up of a generally disk-shaped member, the bottom of which contains a large concentric aperture, thus leaving a generally planar ring portion or ledge about the periphery of the bottom surface. The top of the lower housing terminates in an outwardly extending flange. The lower housing portion is made of oxygen-free high conductivity (OFHC) copper that is plated first with nickel and then copper. The ledge of the lower housing is brought into alignment with the periphery of the top surface of the sapphire base. Disposed between the top surface and the ledge is a planar ring-shaped washer made of KOVAR.

One surface of the KOVAR washer is brought into intimate bonding contact with the top surface of the sapphire base. The other surface of the KOVAR washer is brought into intimate bonding contact with the ledge. The KOVAR washer provides a thermal expansion matching interface between the OFHC copper of the lower housing and the sapphire base. The ring structure of the washer results in a long diffusion distance for external gases or organic contaminants and other environmental materials.

The upper housing portion consists of a disk-shaped element that is basically identical to the lower housing portion with the exception that the top surface does not include an aperture. The upper housing portion includes a flange that is sized and shaped to compliment the flange of the lower housing portion so that when the upper and lower housing portions are joined together along the flange and welded through cold welding, an hermetically sealed evacuated inner chamber is formed for housing the crystal.

All of the terminal pins are of the same length with the exception of one which is shorter than the rest of the terminals and is used to define a ground terminal. Each of the interior surfaces of the apertures in the base member contain a solderable metallized surface.

Associated with each of the terminals is a metallized band that terminates at one end in a ring portion. Emanating from one end of the ring is a tapered neck portion that expands into an elongated rectangular shape body portion. The band is coated or impregnated by metal spraying or vacuum evaporation so that the ring is coterminus with one of the apertures defined in the sapphire base. The metallized band is positioned along the under surface of the base portion. The body of the band is then formed so that it lies along a diagonal of the base member and passes around the curved portion so that the end of the body rests against the peripheral edge of the base.

In another embodiment of the header package, a domed lid provides a package that is able to withstand high shock.

The alternative embodiment also contains a slightly different arrangement of the terminals. In particular, the heads are spaced a pre-determined distance away from the under surface of the sapphire base.

In still another embodiment of the subject invention, the way in which the ribbons are mounted to the terminals is changed along with the orientation of the terminal pins.

Thus, it is a primary object of the present invention to provide a crystal header package of low profile design and employing a sapphire bottom plate.

It is another object of the present invention to provide a header package where leak rates of contaminants are minimized.

It is a further object of the present invention to provide a header package in which a crystal mounted therein exhibits superior output frequency stability.

Still, a further object of the present invention to provide an improved method of producing a low profile crystal header package.

These and other objects and advantages will become apparent when the detailed description of the preferred embodiments is viewed in conjunction with the following drawings.

BRIEF DESCRIPTION OF THE DRAWINGS

FIG. 4 is a view taken along lines 4—4 of FIG. 3.

FIG. 5 is a view taken along lines 5—5 of FIG. 4.

FIG. 6 is a view similar to that of FIG. 4 used to show an alternative embodiment of the present invention.

FIG. 7 is a view similar to that of FIG. 4 used to show yet an additional embodiment of the subject invention.

DETAILED DESCRIPTION OF THE PREFERRED EMBODIMENTS

Figure 1:
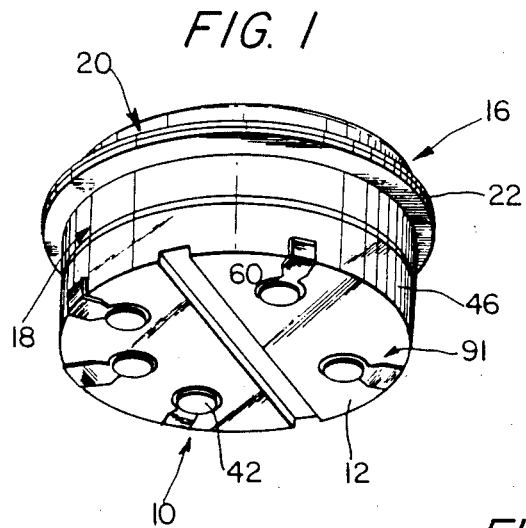
FIG. 1 is a bottom perspective view showing a first embodiment of a crystal header package incorporating the teachings of the present invention.
Figure 3:
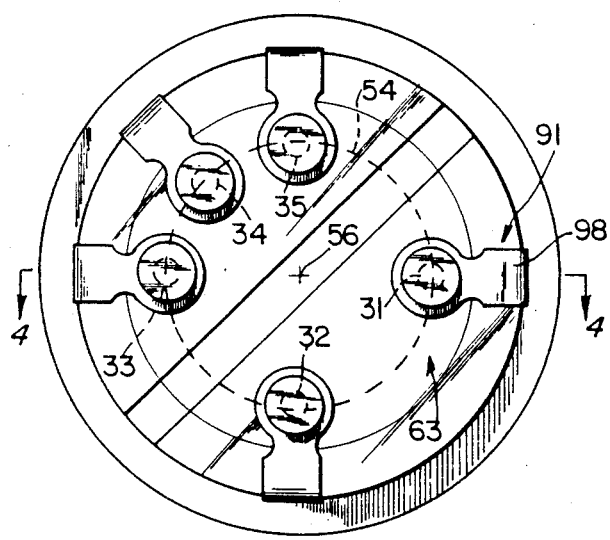
FIG. 3 is a bottom plan view of the embodiment of FIG. 1.

In describing the preferred embodiments of the subject invention illustrated in the drawings, specific terminology will be resorted to for the sake of clarity. However, the invention is not intended to be limited to the specific terms so selected, and it is to be understood that each specific term includes all technical equivalents which operate in a similar manner to accomplish a similar purpose.

A header package embodying the teachings of the present invention is generally designated as 10 in FIGS.

1 and 2. The package basically comprises a sapphire base 12 formed in the general shape of a disk from a single crystal. Mounted thereto through the use of a KOVAR washer 14 is a metallic housing 16 that consists of a lower housing portion 18 and an upper housing portion 20 joined together at flange seal 22 through the use of a cold weld. Mounted within apertures 58 provided in the sapphire base 12 are five terminals 31 through 35 arranged in a conventional bulk acoustic wave and lateral field pattern. Pins 31 through 33 and 35 may be used for electrical connections or mechanical support.

As oriented in FIG. 4, the top portion of each pin has welded to it a metallic nickel ribbon 37 that terminates in a ledge 39. Collectively, the ledges of four of the ribbons support a plano-convex piezoelectric crystal 40. At the point of contact between the crystal edge and the support area 39 each of the ribbons is bonded to the crystal through spot welding. The spot welding is done utilizing standard Unitek spot welding equipment bearing Product No. 1-048-02 with appropriately sized tips.

The terminals 31 through 35 terminate at their end that emerges from the base in a flat disk-like portion or head 42. The head is in intimate conductive contact with a wrap-around metallized surface 44 that has been previously deposited on the bottom and side surfaces of the sapphire base member 12.

Having generally defined an embodiment of a header package 10 incorporating the teachings of the present invention, a more detailed description of the embodiment will now be provided.

With reference to FIGS. 1 through 4, the sapphire base member 12 is generally disk-shaped with a circumferential peripheral edge 46. The base, fashioned from a single crystal, also has planar top and bottom surfaces 48 and 50, respectively, that are parallel to each other. The point where the bottom surface 50 meets the peripheral edge 46 is defined by a curved surface 52 that deviates from planarity in a smooth and continuous fashion. All surfaces of the sapphire base member have been highly polished using planetary lapping so that the surface is flat and optically clear. Defined along a circumferential line 54 which is concentric with the central axis 56 and inwardly spaced from the periphery of the base are a series of five apertures 58 that are positioned in what is known as a cold weld crystal holder terminal arrangement for a crystal. Each of the apertures 58 extends throughout the entire width of the base from the top surface 48 to the bottom surface 50 in order to provide mating mounting tubes for the terminal pins 31 through 35

Defined within the bottom surface 50 is a slot or groove 60 that extends across the entire diameter of the bottom surface and passes through the central axis 56 of the base. The slot 60 is positioned so that there is a group of three apertures 61 on one side of the slot and the remaining two apertures 63 on the other side of the slot. The slot mates with a protruding strip defined on a printed circuit board to facilitate placement and orientation of the header package in preparation for soldering of the terminal pins to electrical contacts on the printed circuit board. In the alternative, the protruding strip is defined at the tip of a robot arm forming part of an automatic header package placement device.

The sapphire base provides the greatest benefit by minimizing leakage of contaminates. Sapphire in the form of a single crystal provides ultimate protection from leaking through the base member. Sapphire has the additional benefit of being a surface which can be cleaned more easily because of its molecular characteristics. Sapphire has electrically compensated atoms at the surface of the crystal, making it less chemically active. The surfaces in the sapphire base member are also polished, thus reducing the surface area, resulting in fewer atoms where contaminates can attach.

The clarity of sapphire provides a window to allow a laser to frequency adjust the resonator. With reference to FIG. 6, a schematic representation of the technique employed to laser adjust the frequency of the crystal 40 shown. Initially, a metallic coating applied by a conventional technique such as brazing is applied to the center of the top surface 48 of sapphire base 12. After the header package has been assembled, a laser beam from a laser, such as a YAG-laser, is passed in a direction noted by arrow A through the underside of base member 12 to heat and, thus, vaporize the metal layer 21. The vaporized metal is deposited on the underside of crystal 40 as a layer 23.

The addition of metal to the underside of the crystal, causes the frequency of the crystal to decrease. The lowering of the frequency can be reversed by introducing a laser beam at an angle (arrow B) so that the beam heats the layer 23 on the underside of the crystal 40 while not disturbing the layer 21. The heat causes layer 23 to start to vaporize with a portion of the vaporized metal coming to rest on layer 21 on the sapphire base member 12. The laser can vaporize the surface of the metal causing a reduction in the mass loading of the resonator or piezoelectric crystal increasing its frequency. If a small reservoir of metal is placed appropriately, then the laser increases the mass loading of the resonator by vaporizing the reservoir.

Figure 2:
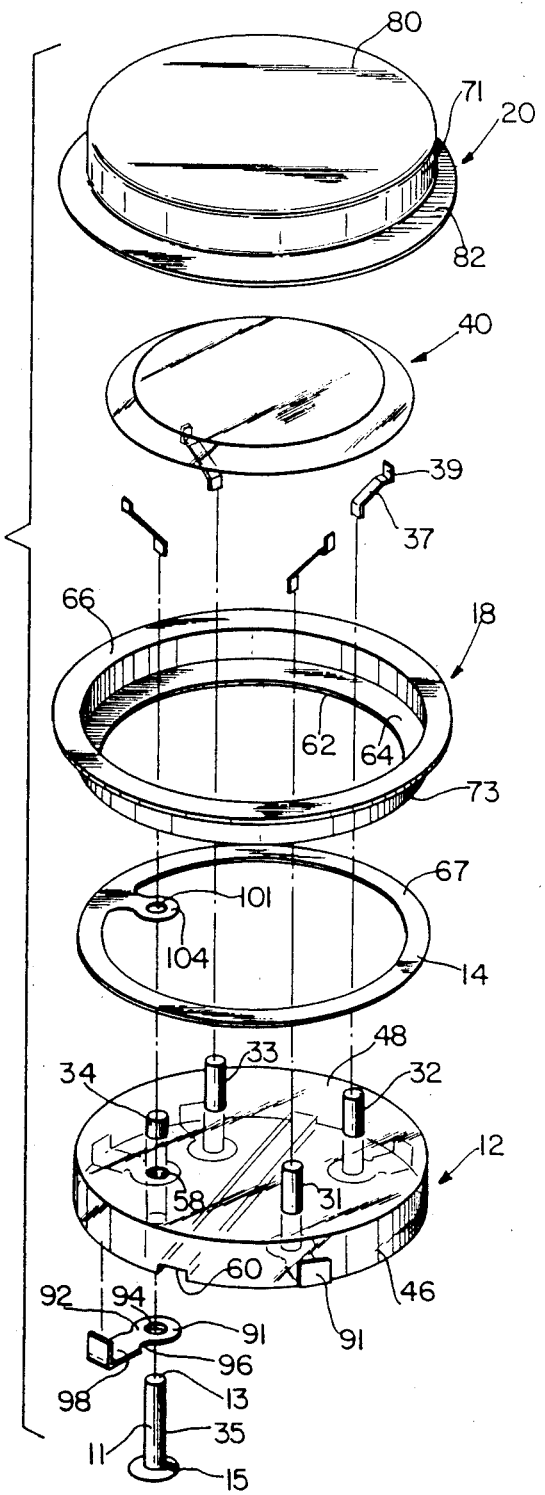
FIG. 2 is an exploded view of the embodiment of FIG. 1.

With reference to FIGS. 2, 4 and 5, the lower housing portion 18 is made up of a generally disk-shaped member, the bottom of which contains a large concentric aperture 62, thus leaving a generally planar ring portion 64 about the periphery of the bottom surface. The top of the lower housing 18 terminates in an outwardly extending flange 66. As shown in cross-section in FIG. 4, the peripheral side wall 73, the ring 64 and the flange 66 are essentially the same thickness. Side wall 73, which defines the circumferential periphery of the lower portion, has a height that is kept to a minimum in order to provide a low profile package.

The lower housing portion is made of oxygen-free high conductivity (OFHC) copper in a cladding with KOVAR consisting of 70% KOVAR and 30% OFHC copper. The cladding is then plated with nickel over which is plated gold. In a preferred embodiment, the nickel should be approximately between 100 and 200 micro-inches whereas the gold should be approximately between 100 and 200 micro-inches.

As shown in FIGS. 2, 4 and 5, the ledge 64 of the lower housing 18 is brought into alignment with the peripheral rim of the top surface 48 of the sapphire base. Disposed between the rim of the top surface 48 and the ledge 64 is the planar ring-shaped washer 14 made of KOVAR.

One surface 65 of the KOVAR washer is brought into intimate bonding contact with the surface 48 of the sapphire base. The other surface 67 of the KOVAR washer is brought into intimate bonding contact with the ledge 64 which, along with the remainder of the lower housing, has been gold plated.

In order to accomplish the appropriate bond between the KOVAR washer and the sapphire base, metal is brazed onto the sapphire base. In a preferred embodiment, a reflow brazing technique is employed to deposit a metallic layer of chrome-gold or KOVAR in a ring about the periphery of the top surface 48 of the base member 12. In a vacuum, the metal for forming the metallic layer is heated over approximately a 12-hour period to a temperature of about 1500° F. The temperature is held for about one-half hour and then gradually reduced over approximately the same time period of 12 hours until ambient temperature is reached.

The KOVAR is then bonded to this metal through a similar reflow process operation in an oven. It has been determined that by bonding the KOVAR ring to the sapphire in this manner, an extremely strong and reliable, leakless bond is provided. In similar fashion, the gold plated ledge of the lower housing is thermal bonded to the remaining surface of the KOVAR washer in order to provide an extremely reliable leakless bond. In fact, Helium leak rates better than $1 \times 10^{-10}$ atm cc/sec have been observed.

The KOVAR washer provides a thermal expansion matching interface between the OFHC copper of the lower housing 18 and the sapphire base 12. The ring structure 14 results in a long diffusion distance for external gases or organic contaminants and other environmental materials.

As shown in FIGS. 2 and 4, the upper housing portion 20 consists of a disk-shaped element that is basically identical to the lower housing portion with the exception that the top surface 80 does not include an aperture. As with the lower housing portion, the upper housing portion is made of a cladding with 70% KOVAR and 30% OFHC copper and the height of wall 71 is kept to a minimum. The nickel and gold plates are also included. The upper housing portion includes a flange 82 that is sized and shaped to compliment the flange 66 of the lower housing portion so that when the upper and lower housing portions are joined together along the flange and welded through cold welding, an hermetically sealed evacuated inner chamber 82 is formed for housing the crystal 40. In a preferred embodiment, the cold welding takes place in an evacuated chamber at an applied pressure of from about 80,000 to 100,000 psi at the weld joint. The cold welding is done in a vacuum at a temperature from about 200° C. to 350° C. at the applied pressure for about one-half to 5 minutes.

As stated before, all of the surfaces of both the upper and lower housing portions are first finished with a nickel plate and then are gold plated. This ensures that oxidation of the OFHC copper is minimized. It also provides excellent thermal conductivity for use in fast warm-up situations. By the same token, OFHC copper provides an excellent material for use in sealing the portions of the housing. Copper also provides desirable thermal conductivity for use in ovenized crystal oscillators where warm-up time is of primary importance.

With reference to FIGS. 1, 2 and 4, the way in which the various terminal pins 31 through 35 are mounted and secured within the metallized apertures 58 defined in the sapphire base 12 will no be described. All of the terminal pins consist of two basic structural elements. With specific reference to FIG. 2, each terminal includes a long slender shaft 11 terminating at one end in a head 15 in the shape of a disc and at the other end in a flat surface 13. All of the terminals are of the same length with the exception of terminal 34 which is shorter than the rest of the terminals and is used to define a ground terminal. Each of the interior surfaces of the apertures 58 contains a solderable metallized surface formed by a reflow brazing process similar to that previously discussed with regard to securing the KOVAR ring 14 to the base member 12. However, instead of applying pressure to the surface, a different deposition method is used. In particular, the base member is masked to cove at least the bottom surface and only reveal the aperture 58. The masked member is then suspended at an angle for rotation above a pair of tungsten boats filled with melted chrome and gold, respectively, or a single boat filled with KOVAR. As the metal melts, a certain portion of the metal evaporates and finds its way into the several apertures 58. By tilting and rotating the base member 12, complete coverage of the apertures is assured. Each of the terminal pins are covered by a KOVAR sleeve 57 and then individually inserted into one of the apertures. The pin-KOVAR sleeve combinations are then subjected to a brazing operation in order to create a seal between the pin and the sapphire base.

Associated with each of the terminals is a metallized band 91 that terminates at one end in a ring portion 92. Defined within the ring portion is an aperture 94 of slightly larger diameter than that of the diameter of the shaft 11 of the terminal pins. Emanating from one end of the ring is a tapered neck portion 96 that expands into an elongated rectangular shape body portion 98. Band 91 is coated or impregnated by metal spraying or vacuum evaporation so that the ring 92 is co-terminates with one of the apertures 58 defined in the sapphire base. The metallized band is positioned along the under surface 50 of the base portion. The body 98 of the band 91 is then formed so that it lies along a diagonal of the base member and passes around the curved portion 52 so that the end of the body 98 rests against the peripheral edge 44 of the base. When a finished header package is mounted onto a printed circuit board through soldering, a certain amount of the solder will travel from the head 15 of each terminal pin and along the body 98 of each band 91 so that some of the solder will come to rest along the portion of the body 98 that is positioned against the peripheral edge 44 of the base 12. This provides a ready indication to an observer that solder has been successfully applied to the appropriate terminal of the header package in order to create the electrical connection between the circuit board and the appropriate terminal of the header package.

With reference to FIGS. 2 and 5, terminal pin 34 is used to define a ground connection. In doing so, the shaft of the pin terminates so that it extends a minimum amount above the sapphire surface 48. The shaft is just long enough so that it passes through an aperture 101 defined in a grounding tab 104 that forms part of the KOVAR ring 14.

FIG. 6 shows another embodiment of a header package incorporating the teachings of the present invention. Like reference numerals denote like elements. An important difference between this embodiment and the previously described embodiment of the header package relates to the provision of a domed lid 110 in the upper housing portion 20. The domed lid defines a slightly concave interior surface 112 within the compartment 82. Although the domed lid slightly increases the interior volume of the compartment 82, it nevertheless serves a very useful purpose in providing a package that is able to withstand high shock.

The alternative embodiment also contains a slightly different arrangement of the terminals 31 through 35. In particular, rather than having the heads of the terminals flush with the under surface of the base, in the alternative embodiment, the length of the shaft 11 for each terminal is such that the heads 15 are spaced a pre-determined distance away from the under surface 50 of the sapphire base 12.

In yet another embodiment of the subject invention, the way in which the ribbons are mounted to the terminals is changed. With reference to FIG. 7, each of the terminals 31 through 35 are inserted so that the heads 15 of the terminals rest against the top surface 48 of the sapphire base 12 with the shafts 11 of the terminals passing through the apertures 58 so that the unadorned ends 111 of each terminal extend outwardly and away from the bottom surface 50 of the sapphire base 12. Each of the ribbons 37 contains a right angle bend 38 and a connecting surface 36 so that the ribbons may be welded to the tops of each of the heads 15 in an arrangement similar to that shown in the first embodiment.

From the above, it is apparent that many modifications and variations of the present invention are possible in light of the above teachings. It is, therefore, to be understood that, within the scope of the appended claims, the invention may be practiced otherwise than as specifically described.

What is claimed is:

1. A crystal header package for mounting a crystal, said package comprising;
    a base member made of a single crystal of sapphire, said base member having a top surface, a bottom surface and a peripheral side surface joining said top and bottom surfaces;
    a metallic housing having an opening defined by a planar ring portion, said ring portion being sized to mate with said top surface in order to create a seal between an interior of said housing and said top surface of said base member, said interior of said housing and said to surface of said base member defining a sealed chamber, the housing including an outwardly extending dome for increasing shock resistance of the header package;
    a metallic ring interposed between said top surface of said base member and said ring portion, said metallic ring being made of KOVAR;
    a plurality of terminals for mounting said header package, said terminals passing through apertures defined within said base member;
    means for sealing said terminals within said apertures; and
    a metallic ribbon connecting means electrically connected to a plurality of said terminals for mounting and supporting said crystal within said sealed chamber defined within said housing.

2. The header package of claim 1, wherein said metallic housing comprises an upper housing portion and a lower housing portion, each of said housing portions having a flange circumscribing the entire housing, said flanges joined together by cold welding.

3. The header package of claim 2, wherein said upper housing portion includes an outwardly extending dome, said dome increasing the shock resistance of said header package.

4. The header package of claim 1, wherein all of the surfaces of said metallic housing are gold plated.

5. The header package of claim 1, further comprising a positioning means defined on the bottom surface of said base member.

6. A crystal header package for mounting a crystal, said package comprising:
    a base member made of a single crystal of sapphire, said base member having a to surface, a bottom surface and a peripheral side surface joining said top and bottom surfaces, the bottom surface comprising a positioning means which comprises a groove defined along a diagonal of said bottom surface;
    a metallic housing having an opening defined by a planar ring portion, said ring portion being sized to mate with said top surface in order to create a seal between an interior of said housing and said top surface of said base member, said interior of said housing and said to surface of said base member defining a sealed chamber;
    a metallic ring interposed between said top surface of said base member and said ring portion, said metallic ring being made of KOVAR;
    a plurality of terminals for mounting said header package, said terminals passing through apertures defined within the base member;
    means for sealing said terminals within said apertures; and
    a metallic ribbon connecting means electrically connected to a plurality of said terminals for mounting and supporting said crystal within said sealed chamber defined within said housing.

7. The header package of claim 1, wherein each of said terminals comprises an elongated shaft terminating at one end in a head.

8. The header package of claim 1, further comprising means secured to said base member and in contact with a terminal for giving a visual indication of a successful soldering of a portion of said terminal to a position of intended use.

9. The header package of claim 7, wherein said head is disk-shaped.

* * * * *